United States Patent
Jung et al.

(10) Patent No.: US 8,435,808 B2
(45) Date of Patent: May 7, 2013

(54) LIGHT EMITTING DIODE PACKAGE AND MANUFACTURING METHOD THEREOF

(75) Inventors: Won Ho Jung, Namyangju-si (KR); Hun Yong Park, Suwon-si (KR); Jung Chul Kang, Seoul (KR); Kyung Taeg Han, Hwaseong-si (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 13/281,079

(22) Filed: Oct. 25, 2011

(65) Prior Publication Data
US 2012/0126267 A1 May 24, 2012

(30) Foreign Application Priority Data
Nov. 24, 2010 (KR) .................. 10-2010-0117586

(51) Int. Cl.
*H01L 21/00* (2006.01)
(52) U.S. Cl.
USPC ............ 438/27; 438/25; 438/29; 257/98; 257/99; 257/100
(58) Field of Classification Search ............ 438/25, 438/27, 29; 257/98–100, E33.059, E33.068
See application file for complete search history.

(56) References Cited

U.S. PATENT DOCUMENTS

| 6,624,491 B2 * | 9/2003 | Waitl et al. ............ 257/434 |
| 6,897,490 B2 * | 5/2005 | Brunner et al. ........... 257/98 |
| 2008/0179614 A1 | 7/2008 | Wang et al. |

FOREIGN PATENT DOCUMENTS

KR 10-0845041 7/2008

\* cited by examiner

*Primary Examiner* — Theresa T Doan
(74) *Attorney, Agent, or Firm* — McDermott Will & Emery LLP

(57) ABSTRACT

A method for manufacturing a light emitting diode (LED) package is provided. The method includes preparing a package body including a first lead frame formed with a cavity and inserted on one side of a bottom surface of the cavity and a second lead frame inserted on the other side, mounting an LED chip on the bottom surface and electrically connecting the LED chip with the first lead frame and the second lead frame, forming a molding portion by a molding resin in the cavity, connecting, to the package body, a first mold corresponding to the molding portion and including a through hole having an inner surface linearly or non-linearly inclined, connecting a second mold to an upper surface of the first mold, forming a lens portion on the molding portion by a transparent resin, and separating the first mold and the second mold from the package body.

9 Claims, 5 Drawing Sheets

LIGHT EMITTING DIODE PACKAGE AND MANUFACTURING METHOD THEREOF

CROSS-REFERENCE TO RELATED APPLICATION

This application claims the benefit of Korean Patent Application No. 10-2010-0117586, filed on Nov. 24, 2010, in the Korean Intellectual Property Office, the disclosure of which is incorporated herein by reference.

BACKGROUND

1. Field

Example embodiments of the following description relate to a light emitting diode (LED) package capable of reducing delamination and separation among components of the LED package, and a manufacturing method thereof.

2. Description of the Related Art

A light emitting diode (LED) chip refers to a semiconductor device which forms a light source by altering materials of a compound semiconductor, such as GaAs, AlGaAs GaN, InGaInP, and the like; whereby the LED chip emits various colors through the light source.

Recently, a conventional LED chip with low brightness is being developed into a high-brightness and high-quality LED chip. Furthermore, since blue and white LEDs having high performance are realized, application of the LED chip is widening to a display, next-generation lighting, and so forth.

The LED chip is generally manufactured into a package type.

FIG. 1 illustrates a sectional view showing a structure of an LED package 10 according to a conventional art. Referring to FIG. 1, the LED package 10 includes a package body 11 connected with a pair of lead frames 12a and 12b and formed with a cavity 11a, an LED chip 13 mounted on the lead frames 12a and 12b disposed in the package body 11, a wire 14 connecting the LED chip 13 with the lead frame 12b, and a molding portion 15 filling an interior of the cavity 11a, to protect a part of the LED chip 13 and the wire 14.

The LED package 10 may further include a lens portion 16 disposed on the molding portion 15 to increase light extraction efficiency and protect the molding portion 15. The lens portion 16 may be formed by filling a lens mold (not shown) with a resin material, in a state where the lens mold is mounted on the molding portion 15, and then separating the lens mold.

However, a physical force operated on the lens mold and the lens portion 16 during a separation of the lens mold may cause delamination at an interface between the lens portion 16 and the molding portion 15.

In addition, since a potential physical force is generated during separation of the lens mold, when the LED package 10 is used under a severe environmental condition, delamination may occur at an interface between the molding portion 15 and the cavity 11a. Also, delamination of the LED chip 13 or separation of the wire 14 may be induced. Thus, delamination and separation may reduce quality and lifespan of the LED package 10.

SUMMARY

According to example embodiments, there may be provided a light emitting diode (LED) package capable of minimizing delamination or separation among components by a mold configured to reduce a physical force operated to a lens portion during separation of the lens portion, and a method for manufacturing the LED package.

The foregoing and/or other aspects are achieved by providing a method for manufacturing a light emitting diode (LED) package, the method including preparing a package body including a first lead frame and a second lead frame, the first lead frame formed within a cavity and inserted on one side of a bottom surface of the cavity to be exposed and the second lead frame inserted on the other side of the bottom surface of the cavity to be exposed, mounting an LED chip on the bottom surface of the cavity and electrically connecting the LED chip with the first lead frame and the second lead frame, forming a molding portion by putting a molding resin in the cavity mounted with the LED chip, connecting a first mold disposed corresponding to the molding portion and formed with a through hole of which an inner surface is either linearly or non-linearly inclined, with respect to an upper surface of the package body, connecting a second mold having a mold pattern disposed corresponding to the through hole, to an upper surface of the first mold, forming a lens portion on the molding portion by putting a transparent resin in the through hole of the first mold and the mold pattern of the second mold, and separating the first mold and the second mold from the package body.

The first mold may include a release coating which extends from the inner surface to one surface of the first mold, not connected to the package body.

The inner surface of the through hole of the first mold may be asymmetrical with respect to a center of the molding portion.

The first mold may include a first sub mold and a second sub mold which are separably connected to each other with respect to the center of the molding portion and are each formed with a recess such that the recesses are symmetrical with respect to the center of the molding portion.

The recesses of the first sub mold and the second sub mold may constitute the through hole when the first sub mold and the second sub mold are connected to each other.

The separating of the first mold and the second mold from the package body may include vertically separating the second mold from the first mold, and horizontally separating the first sub mold and the second sub mold of the first mold.

The through hole of the first mold may cover a larger area than the cavity.

The forming of the molding portion may put the molding resin to a height lower than the upper surface of the package body.

At least one of the molding resin and the transparent resin may include a fluorescent material.

The foregoing and/or other aspects are achieved by providing an LED package including a package body including a cavity, a first lead frame and a second lead frame inserted in the package body to be exposed to one side and to the other side of a bottom surface of the cavity, an LED chip mounted on the bottom surface of the cavity and electrically connected with the first lead frame and the second lead frame, a molding portion disposed in the cavity mounted with the LED chip, and a lens portion disposed on the molding portion, the lens portion of which a circumferential side surface to contact the package body is linearly or non-linearly inclined.

A bonding surface of the lens portion for contact with the package body may be formed larger than the cavity.

The molding portion may have a smaller height than an upper surface of the package body.

At least one of the molding portion and the lens portion may include a fluorescent material.

Additional aspects, features, and/or advantages of example embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the example embodiments, taken in conjunction with the accompanying drawings of which.

DETAILED DESCRIPTION

Figure 1:
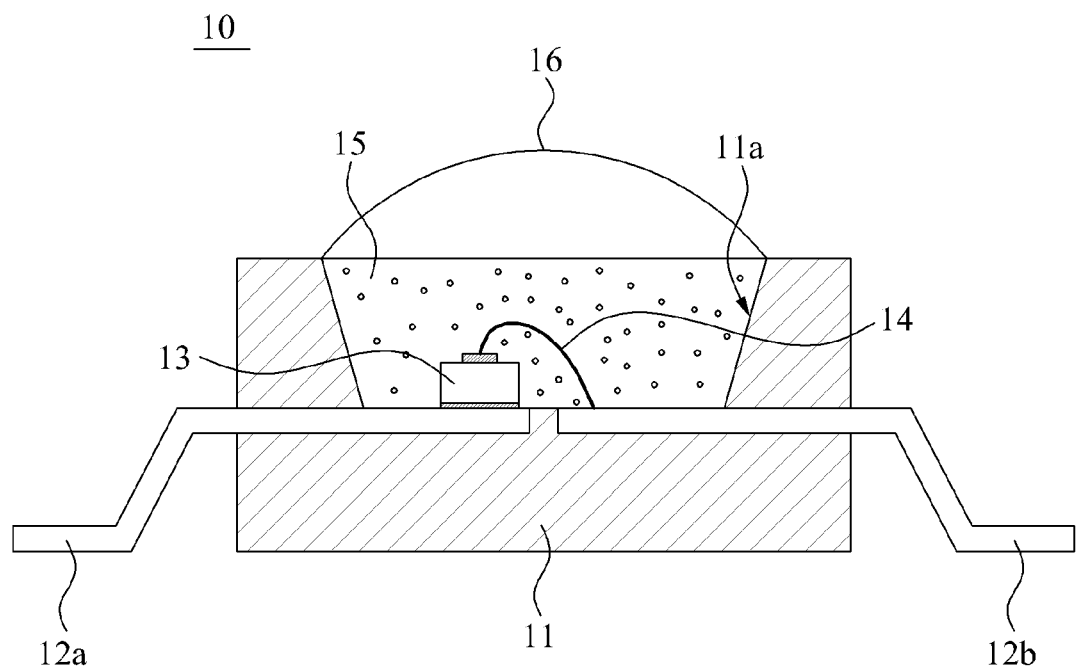
FIG. 1 illustrates a sectional view showing a structure of a conventional light emitting diode (LED) package.

Reference will now be made in detail to exemplary embodiments of the present invention, examples of which are illustrated in the accompanying drawings. In the description of the present invention, if detailed descriptions of related disclosed art or configuration are determined to unnecessarily make the subject matter of the present invention obscure, they will be omitted. Terminology used below is defined based on their functions in the present invention and may vary according to users, user's intentions, or practices. Therefore, the definitions of the terms should be determined based on the entire specification. Like reference numerals denote like elements or structures throughout the drawings.

FIGS. 2 through 6 illustrate sectional views for explaining a method of manufacturing a light emitting diode (LED) package according to example embodiments.

Figure 2:
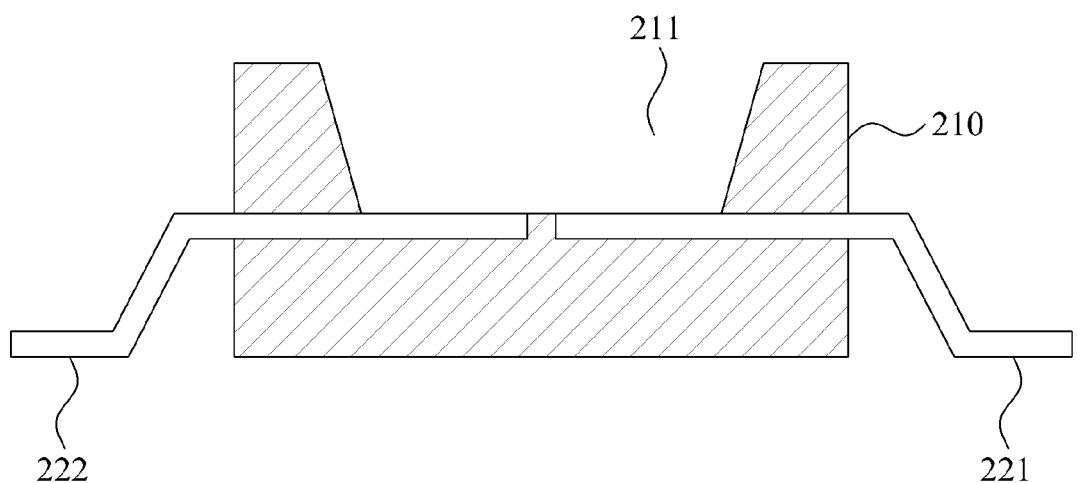
FIGS. 2 through 6 illustrate sectional views for explaining a method of manufacturing the LED package according to example embodiments.

Referring to FIG. 2, a package body 210 is provided to mount an LED chip thereon. Specifically, the package body 210 includes a cavity 211, a first lead frame 221 inserted in one side of a bottom surface of the cavity 211 to be exposed to the outside, and a second lead frame 222 inserted in the other side of the bottom surface of the cavity 211 to be exposed to the outside. In the following description, a surface of the package body 210 formed with the cavity 211 will be referred to as an upper surface while the other surface without the cavity 211 will be referred to as a lower surface.

Figure 3:
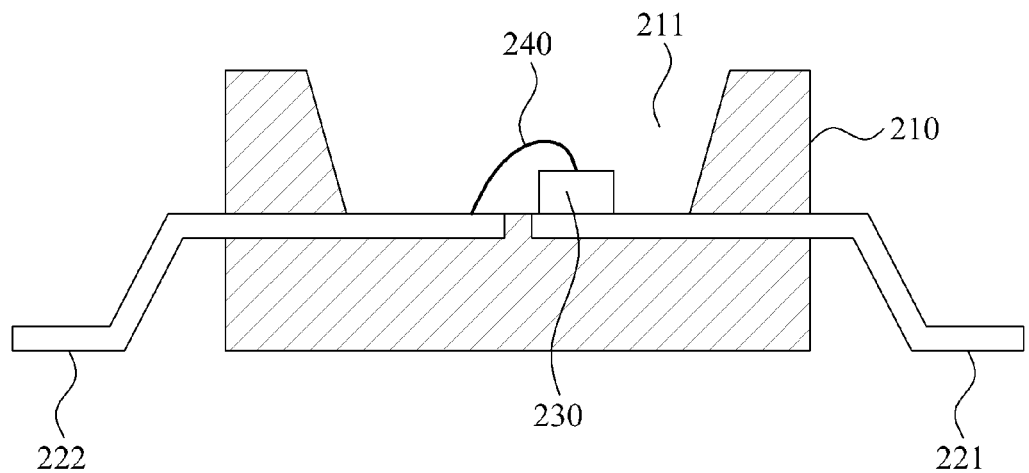

Referring to FIG. 3, an LED chip 230 is mounted to the package body 210 shown in FIG. 2 and electrically connected with the first lead frame 221 and the second lead frame 222. Specifically, the LED chip 230 is mounted on the first lead frame 221, and then bonded to the second lead frame 222 by a wire 240. However, the electric connection of the LED chip 230 to the first lead frame 221 and the second lead frame 222 is not limited to the method using the wire 240 but may vary depending on an electrode structure of the LED chip 230. For example, the LED chip 230 may be connected to the first lead frame 221 and the second lead frame 222, respectively, using a plurality of wires. Alternatively, the LED chip 230 may be connected to the first lead frame 221 and the second lead frame 222 by flip-chip bonding.

Figure 4:
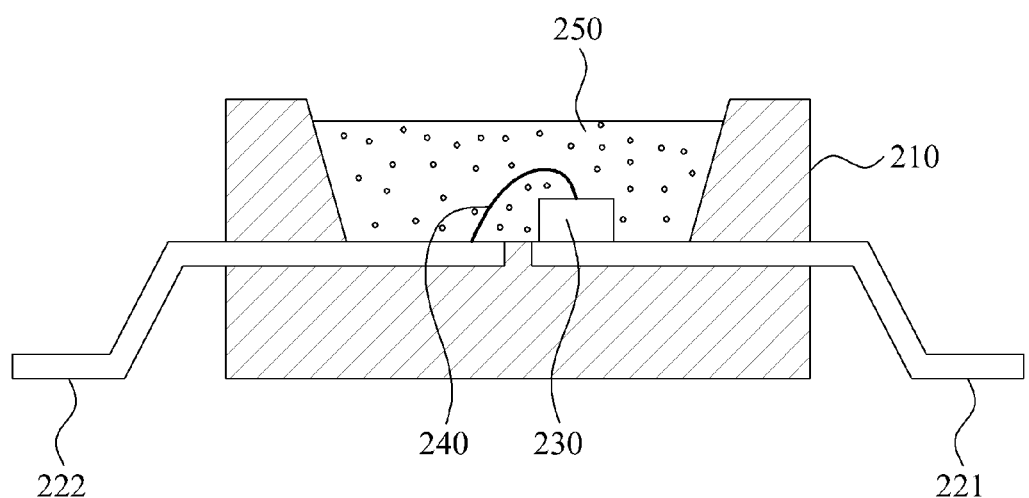

Referring to FIG. 4, a molding portion 250 adapted to protect the LED chip 230 is formed by putting a molding resin in the cavity 211 where the LED chip 230 is mounted. Transparent epoxy, silicone, and the like may be used as the molding resin. The molding portion 250 may be formed lower than the upper surface of the package body 210.

Figure 5:
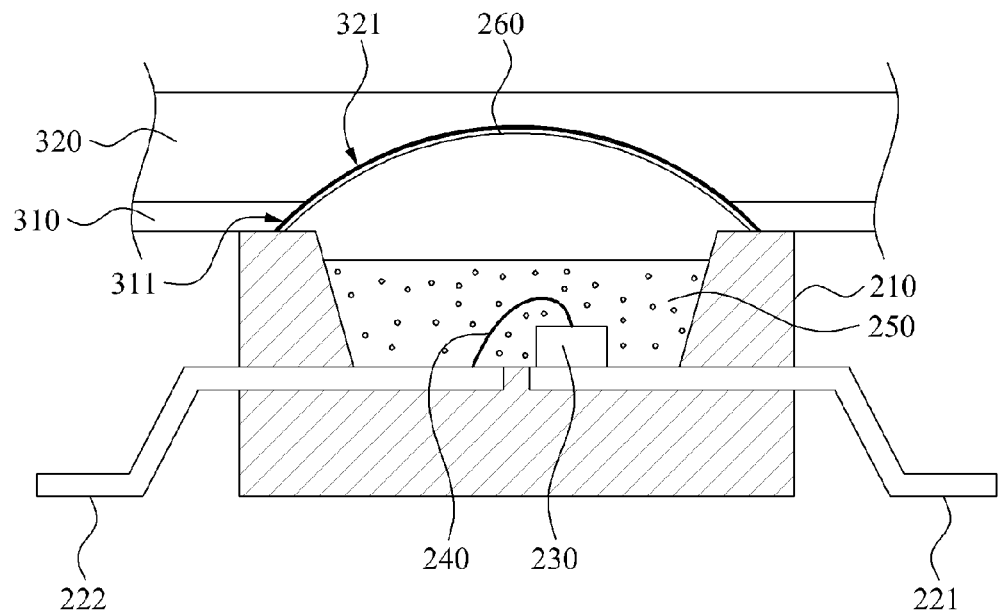

Referring to FIG. 5, a lens portion 260 is formed by a first mold 310 and a second mold 320. Specifically, the first mold 310 is connected to the upper surface of the package body 210. Here, the first mold 310 includes a through hole 311 disposed corresponding to the molding portion 250. An inner surface of the through hole 311 is inclined either linearly or non-linearly with respect to the upper surface.

The first mold 310 shown in FIG. 5 has a curved inner surface of the through hole 311. The through hole 311 may cover a larger area than the cavity 211. Accordingly, when the first mold 310 is connected to the upper surface of the package body 210, the through hole 311 may expose the molding portion 250, a part of the cavity 211, and a peripheral part of the package body 210 around the cavity 211.

The inner surface of the through hole 311 may be either symmetrical or asymmetrical with respect to a center of the molding portion 250.

The second mold 320 is connected to an upper surface of the first mold 310. The second mold 320 includes a mold pattern 321 disposed corresponding to the through hole 311 of the first mold 310. Here, the mold pattern 321 may have the same size as the through hole 311 so as to not generate a step with respect to the through hole 311 at a connection part with the first mold 310 when connected to the through hole 311.

Alternatively, the mold pattern 321 may cover a larger or smaller area than the through hole 311 so that a step is generated between the mold pattern 321 and the through hole 311 at the connection part with the first mold 310.

As described above, in a state where the first mold 310 and the second mold 320 are sequentially connected to the package body 310, a transparent resin may be put in a space constituted by the through hole 311 and the mold pattern 321, thereby forming the lens portion 260 on the molding portion 250. Here, the transparent resin may include silicone or a polymer-based resin.

The molding resin forming the molding portion 250 and the transparent resin forming the lens portion 260 may include a fluorescent material. Therefore, a wavelength of light generated from the LED chip 230 may be varied by the fluorescent material as the light passes through the molding portion 250 or the lens portion 260.

In addition to the first mold 310 and the second mold 320 both as upper molds shown in FIG. 5, a third mold (not shown) as a lower mold may be connected to the lower surface of the package body 210 to form the lens portion 260.

Figure 6:
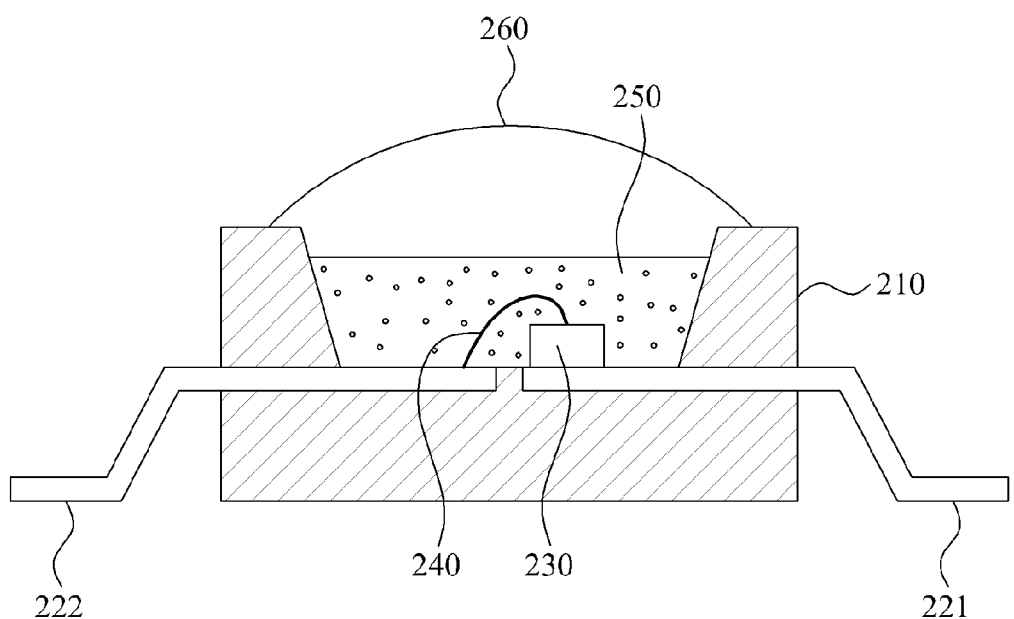

After the lens portion 260 is formed, the first mold 310 and the second mold 320 may be separated from the package body 210, accordingly completing manufacturing of the LED package as shown in FIG. 6.

When the first mold 310 and the second mold 320 are separated from the package body 210, the second mold 320 may be separated first, to be followed by the first mold 310.

During separation of the second mold 320, the first mold 310 may be fixed to a circumferential side surface of the lens portion 260, which contacts the package body 210. Thus, a physical force operating between the second mold 320 and the lens portion 260 may be reduced or removed using the first mold 310.

Consequently, delamination at an interface between the lens portion 260 and the molding portion 250, delamination at an interface between the molding portion 250 and the cavity 211, delamination at the LED chip 203, and separation of the wire 240 may be reduced or prevented.

The LED package shown in FIG. 6 may include the package body 210, the first lead frame 221, the second lead frame 222, the LED chip 230, the wire 240, the molding portion 250, and the lens portion 260.

The package body 210 may include the cavity 211 for mounting of the LED chip 230, and also include the first lead frame 221 and the second lead frame 222 inserted in the bottom surface of the cavity 211 to be exposed. The first lead frame 221 and the second lead frame 222 electrically connect the LED chip 230 with an external circuit.

The first lead frame 221 is exposed on one side of the bottom surface of the cavity 211, extending to the outside through the package body 210.

The LED chip 230 may be mounted on the first lead frame 221 disposed in the cavity 211. In this case, the LED chip 230 includes a first electrode and a second electrode having different polarities from each other and being vertically arranged. Therefore, when the LED chip 230 is mounted on the first lead frame 221, either the first electrode or the second electrode disposed at a lower surface of the LED chip 230 may be electrically connected with the first lead frame 221.

The second lead frame 222 is separated from the first lead frame 221 and exposed to the other side of the bottom surface of the cavity 211. The second lead frame 222 also extends to the outside through the package body 210. In addition, the second lead frame 222 may be electrically connected with one of the electrodes disposed at the lower surface of the LED chip 230, by the wire 240.

The molding portion 250 may be disposed in the cavity 211. The molding portion 250 may be formed to a lower height than the upper surface of the package body 210.

The lens unit 260 is configured to cover the molding portion 250 and a part of the package body 210 around the cavity 211. In other words, the lens portion 260 is disposed on a part of the cavity 211, and a part of the upper surface of the package body 210, thereby increasing a bonding surface area of the lens portion 260. According to the increase in the bonding surface area, a bonding force of the lens portion 260 on the package body 210 increases accordingly. Therefore, even under a severe environmental condition, delamination occurring at the interface between the lens portion 260 and the molding portion 250 may be reduced or prevented.

Figure 7:
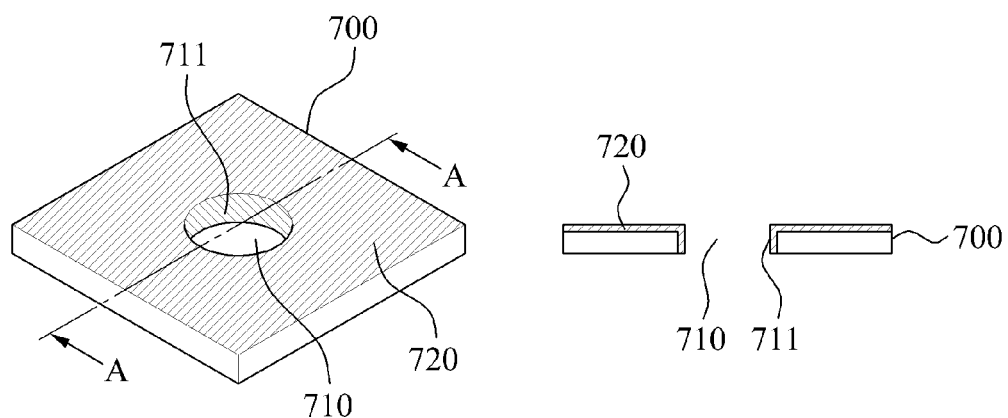
FIGS. 7 through 9 illustrate sectional views for explaining a structure of molds according to example embodiments.
Figure 8:
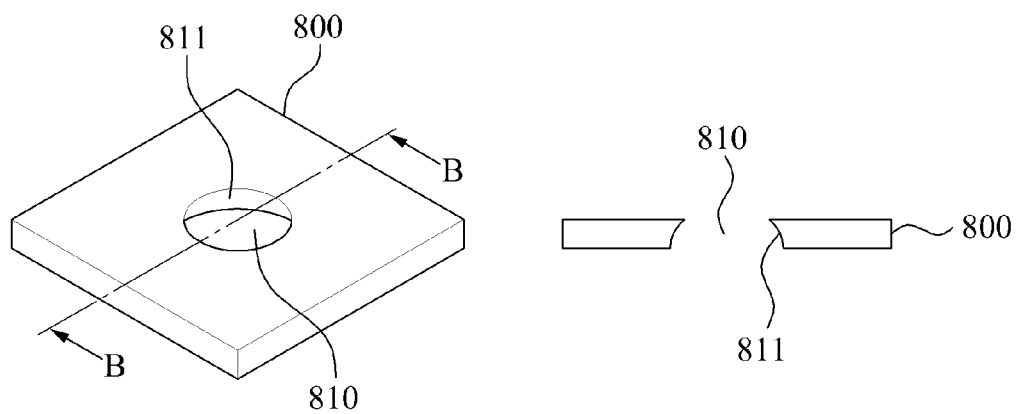
Figure 9:
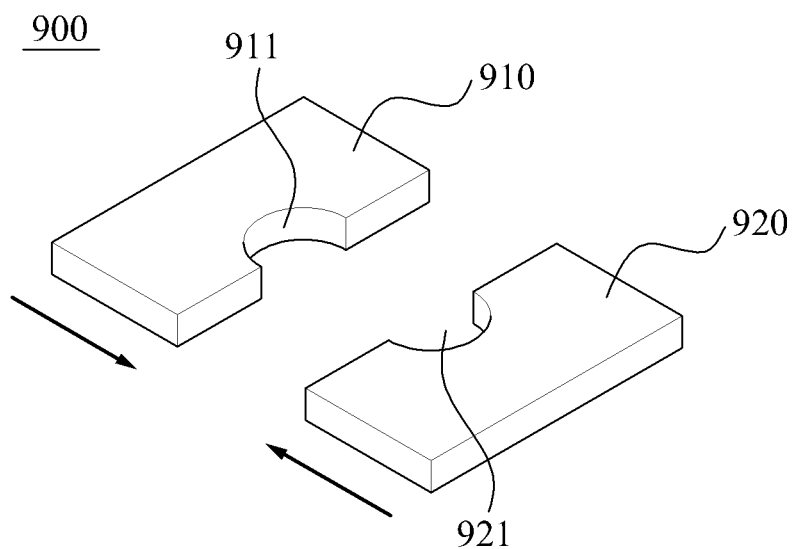
Figure 9:
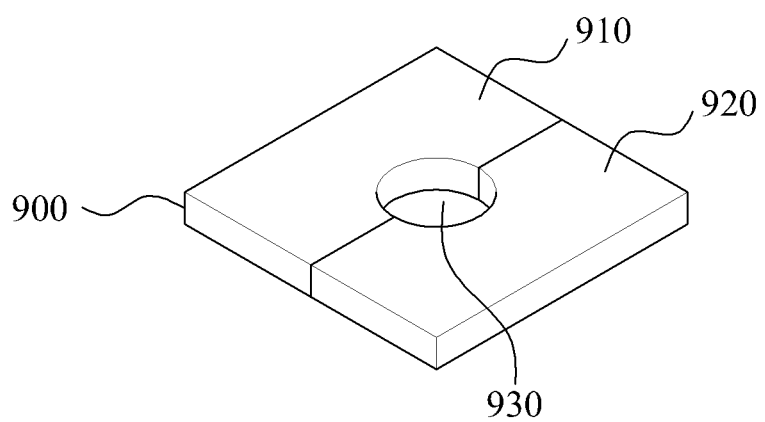

FIGS. 7 through 9 illustrate sectional views for explaining a structure of molds according to example embodiments. The molds suggested in FIGS. 7 through 9 are various embodiments of the first mold 310 used in the manufacturing method illustrated in FIG. 5.

The first mold 310 illustrated in FIG. 5, as a first embodiment of the mold, includes the through hole 311 disposed corresponding to the molding portion 250. The through hole 311 may be larger than the cavity 211 included in the package body 210. Therefore, when the first mold 310 is connected to the upper surface of the package body 210, the through hole 311 may expose the molding portion 250, the part of the through hole 211, and the part of the package body 210 around the cavity 211. An inner surface of the first mold 310 according to the first embodiment may be linearly inclined.

The first mold 310 may reduce or remove the physical force operating between the second mold 320 and the lens portion 260 during separation of the second mold 320. In addition, the first mold 310 is configured so that the lens portion 260 is disposed on the molding portion 250, the part of the cavity 211, and the part of the package body 210 around the cavity 211, which are exposed through the through hole 311; accordingly increasing the bonding surface area of the lens portion 260. Thus, the first mold 310 is fixed to the lens portion 260 during separation of the second mold 320, and increases the bonding force of the lens portion 260. As a consequence, delamination and separation among components of the LED package may be reduced or prevented.

FIG. 7 shows a first mold 700 according to a second embodiment, which includes a through hole 710. An inner surface 711, of the through hole 710, may be bent by about 90 degrees.

Referring to a sectional view of the first mold 700 cut along a line A-A', the first mold 700 may include a release coating 720 extending from the inner surface 711 up to one surface of the first mold 700, the surface not connected with the package body 210.

The release coating 720 may contain wax so that the first mold 700 is efficiently separated from the package body 210 after formation of the lens portion 260. Consequently, the physical force operating between the first mold 700 and the lens portion 260 is reduced or removed, thereby reducing or preventing delamination between the lens portion 260 and the molding portion 250. Also, the release coating 720 may prevent a physical force generated during separation of the first mold 700 from potentially remaining in the LED package. Accordingly, delamination or separation among the components may be reduced or prevented.

FIG. 8 shows a first mold 800 according to a third embodiment, which includes a through hole 810. An inner surface 811 of the through hole 810 may be non-linearly inclined, that is, in the form of a curve having a curvature.

Referring to a sectional view of the first mold 800 cut along a line B-B', the inner surface 811 of the first mold 800 is curved. In this case, the curve may have a constant curvature as shown in FIG. 8, or a variable curvature according to positions.

Referring to FIG. 8, the curve of the inner surface 811 may be symmetrical with respect to a center of the through hole 810. However, not limited thereto, the curve may be asymmetrical.

FIG. 9 shows a first mold 900 according to a fourth embodiment. Different from the first molds 310, 700, and 800 according to the first embodiment to the third embodiment, the first mold 900 includes a first sub mold 910 and a second sub mold 920.

The first sub mold 910 and the second sub mold 920 may be separated from and connected to each other, with respect to the center of the molding portion 250. Although not shown, for easy connection between the first sub mold 910 and the second sub mold 920, the first sub mold 910 and the second sub mold 920 may include a fastening hole (not shown) and a protrusion (not shown) inserted in the fastening hole, respectively, disposed on opposed surfaces facing when connected to each other.

The first sub mold 910 and the second sub mold 920 may includes recesses 911 and 921, respectively, which are symmetrical with respect to the center of the molding portion 250. When the first sub mold 910 and the second sub mold 920 are connected with each other by moving in arrowed directions of FIG. 9, the recesses 911 and 921 are interconnected, thereby forming a through hole 930.

When the lens portion 260 is formed using the first mold 900 of FIG. 9, the second mold 320 of FIG. 5 may be vertically separated from the first mold 900. The first mold 900 may be horizontally separated from the package body 210, that is, by horizontally moving the first sub mold 910 and the second sub mold 920 in an opposite direction to a direction for connecting the first sub mold 910 and the second sub mold 920.

When the first mold 900 is separated, the physical force operating between the first mold 900 and the lens portion 260 is generated in a horizontal direction, not in a vertical direction. Therefore, separation of the first mold 900 may be performed without affecting the bonding force between the lens portion 260 and the molding portion 250. As a result, delamination may be reduced or prevented from occurring at the lens portion 260 and the molding portion 250.

Although the first molds 800 and 900 shown in FIGS. 8 and 9, respectively, have been illustrated as not including the release coating, the first molds 800 and 900 may also include the release coating as shown in FIG. 7.

According to the embodiments, a mold is configured to reduce a physical force of a lens portion when separated from the package body. Therefore, a bonding force between the lens portion and a molding portion in an LED package may increase. Accordingly, delamination or separation among components of the LED package are reduced, thereby increasing quality and lifespan of the LED package.

Although example embodiments have been shown and described, it would be appreciated by those skilled in the art that changes may be made in these example embodiments without departing from the principles and spirit of the disclosure, the scope of which is defined in the claims and their equivalents.

What is claimed is:

1. A method for manufacturing a light emitting diode (LED) package, the method comprising:
   preparing a package body comprising a first lead frame and a second lead frame, the first lead frame formed with a cavity and inserted in on side of a bottom surface of the cavity to be exposed and the second lead frame inserted on the other side of the bottom surface of the cavity to be exposed;
   mounting an LED chip on the bottom surface of the cavity and electrically connecting the LED chip with the first lead frame and the second lead frame;
   forming a molding portion by putting a molding resin in the cavity mounted with the LED chip;
   connecting a first mold disposed corresponding to the molding portion and formed with a through hole of which an inner surface is either linearly or non-linearly inclined with respect to an upper surface of the package body;
   connecting a second mold having a mold pattern disposed corresponding to the through hole, to an upper surface of the first mold;
   forming a lens portion on the molding portion by putting a transparent resin in the through hole of the first mold and the mold pattern of the second mold; and
   separating the first mold and the second mold from the package body.

2. The method of claim 1, wherein the first mold comprises a release coating which extends from the inner surface to one surface of the first mold, not connected to the package body.

3. The method of claim 1, wherein the inner surface of the through hole of the first mold is asymmetrical with respect to a center of the molding portion.

4. The method of claim 1, wherein the first mold comprises a first sub mold and a second sub mold which are separably connected to each other with respect to the center of the molding portion, and each formed with a recess such that the recesses are symmetrical with respect to the center of the molding portion.

5. The method of claim 4, wherein the recesses of the first sub mold and the second sub mold form the through hole when the first sub mold and the second sub mold are connected to each other.

6. The method of claim 4, wherein the separating of the first mold and the second mold from the package body comprises:
   vertically separating the second mold from the first mold; and
   horizontally separating the first sub mold and the second sub mold of the first mold.

7. The method of claim 1, wherein the through hole of the first mold covers a larger area than the cavity.

8. The method of claim 1, wherein the forming of the molding portion puts the molding resin to a height lower than the upper surface of the package body.

9. The method of claim 1, wherein at least one of the molding resin and the transparent resin comprises a fluorescent material.

\* \* \* \* \*